US009444455B2

(12) United States Patent
Bhuiyan et al.

(10) Patent No.: US 9,444,455 B2
(45) Date of Patent: Sep. 13, 2016

(54) LOAD IMPEDANCE ADJUSTMENT FOR AN INTERFACE OF A DATA STORAGE DEVICE

(71) Applicant: SANDISK TECHNOLOGIES INC., Plano, TX (US)

(72) Inventors: Ekram Hossain Bhuiyan, San Jose, CA (US); Steve Xiaofeng Chi, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/102,395

(22) Filed: Dec. 10, 2013

(65) Prior Publication Data

US 2015/0162909 A1    Jun. 11, 2015

(51) Int. Cl.
| | |
|---|---|
| H03K 19/003 | (2006.01) |
| H03K 17/16 | (2006.01) |
| H03K 19/00 | (2006.01) |
| H03K 19/0175 | (2006.01) |
| G06F 13/40 | (2006.01) |
| H03K 19/0185 | (2006.01) |
| H04L 25/02 | (2006.01) |

(52) U.S. Cl.
CPC ....... H03K 19/0005 (2013.01); G06F 13/4086 (2013.01); H03K 19/0175 (2013.01); H03K 19/018557 (2013.01); H04L 25/0278 (2013.01)

(58) Field of Classification Search
CPC .................. H03K 19/0005; H03K 19/00384; H03K 17/164; H03K 19/017545; H03K 17/167; H03K 19/018592; H03K 17/145; H03K 17/6871; H03K 19/01825; H03K 19/018557; H03K 19/0175; H04L 25/0278; H04L 25/0298; G06F 13/4086; G06F 13/4234; G06F 13/00; G11C 29/50008; H01J 37/32183; H03H 7/38; H03H 7/40; H05K 1/0246
USPC .................. 326/30, 21, 26, 83; 327/108–112
See application file for complete search history.

(56) References Cited

U.S. PATENT DOCUMENTS

| | | | | |
|---|---|---|---|---|
| 6,026,456 | A * | 2/2000 | Ilkbahar | 710/100 |
| 6,081,142 | A * | 6/2000 | Douchi et al. | 327/158 |
| 6,166,576 | A * | 12/2000 | Stave | 327/266 |
| 6,285,209 | B1 * | 9/2001 | Sawai | 326/34 |
| 6,297,677 | B1 * | 10/2001 | Ang et al. | 327/170 |
| 6,343,024 | B1 * | 1/2002 | Zabroda | 363/22 |
| 6,349,051 | B1 * | 2/2002 | Klein | 365/63 |
| 6,445,245 | B1 * | 9/2002 | Schultz et al. | 327/541 |
| 6,529,037 | B1 * | 3/2003 | Haycock et al. | 326/30 |
| 6,642,742 | B1 * | 11/2003 | Loyer | 326/30 |
| 6,963,218 | B1 | 11/2005 | Alexander et al. | |
| 7,768,297 | B2 * | 8/2010 | Wilson | 326/30 |
| 8,565,033 | B1 | 10/2013 | Manohararajah et al. | |

(Continued)

FOREIGN PATENT DOCUMENTS

WO     2011041064 A2     4/2011

OTHER PUBLICATIONS

International Search Report and Written Opinion of the International Searching Authority for International Application No. PCT/US2014/067357, mailed Jan. 30, 2015, 15 pages.

*Primary Examiner* — Vibol Tan
(74) *Attorney, Agent, or Firm* — Toler Law Group, PC

(57) ABSTRACT

A data storage device includes a signal source. A load is responsive to the signal source. A method includes adjusting an impedance of the load to reduce an impedance mismatch between the signal source and the load.

24 Claims, 5 Drawing Sheets

(56) References Cited

U.S. PATENT DOCUMENTS

| | | |
|---|---|---|
| 8,570,064 B1 | 10/2013 | Chan et al. |
| 8,588,014 B1 | 11/2013 | Fung et al. |
| 2005/0052200 A1 | 3/2005 | Nguyen et al. |
| 2007/0139071 A1 | 6/2007 | Nguyen |
| 2012/0215958 A1* | 8/2012 | Fai et al. .................. 710/316 |
| 2012/0266048 A1 | 10/2012 | Chung et al. |
| 2013/0088258 A1* | 4/2013 | Yokou et al. ................ 326/30 |
| 2014/0104132 A1* | 4/2014 | Bakalski ............... H03H 7/38 343/861 |

* cited by examiner

LOAD IMPEDANCE ADJUSTMENT FOR AN INTERFACE OF A DATA STORAGE DEVICE

FIELD OF THE DISCLOSURE

The present application is generally related to load impedance adjustment, such as load impedance adjustment for an interface of a data storage device.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. As a result, flash memory devices may enable users to store and access a large amount of data.

To store and access data, a flash memory device may include an interface. The interface may enable the flash memory device to communicate with another device, such as a host device that accesses the flash memory device. To maintain integrity of data that is exchanged via the interface, the flash memory device may perform an impedance matching operation that matches impedances of the flash memory device and the host device. The impedance matching operation may improve integrity of data by reducing reflections and other degradation of signals sent and received via the interface.

SUMMARY

Certain devices perform impedance matching by calibrating an output impedance of a signal source that sends data to another device. The output impedance may be matched to an input impedance of the device that receives the data. Calibrating the output impedance to match the input impedance may reduce reflections of signals sent via the signal source, reducing errors and improving signal integrity. However, a large number of devices may be used to calibrate the output impedance. For example, the signal source may include impedance configuration components of various impedances that can be enabled to calibrate the load impedance. Including a large number of impedance configuration components in the signal source may be infeasible in certain circuit designs. To illustrate, a die size of a "pad-limited" integrated circuit may be determined by a size of a "pad ring" of the integrated circuit. In certain cases, the size of the pad ring cannot be increased to accommodate a large number of impedance configuration components without increasing cost and die size of the integrated circuit. Some devices reduce the number of impedance configuration components to reduce the size of the pad ring. However, reducing the number of impedance configuration components may result in reduced impedance matching resolution, increasing errors in data sent via the signal source.

An impedance matching technique in accordance with the present disclosure may adjust an input impedance of a variable load to reduce an impedance mismatch. To illustrate, a data storage device may include an interface having a signal source, such as an output buffer. A load, such as a memory device, may be responsive to the output buffer (e.g., to receive data sent via the output buffer). Instead of adjusting an output impedance of the output buffer to match an impedance of the load, the data storage device may adjust an input impedance of the variable load, changing the load impedance. Because the impedance matching technique changes the load impedance instead of the output impedance of the output buffer, the variable load can be located outside the interface (e.g., external to the output buffer). Such an impedance matching technique may therefore reduce or eliminate the number of impedance matching components that are located within the output buffer, increasing available pad area, which is valuable in certain circuit designs, such as pad-limited integrated circuit designs.

DETAILED DESCRIPTION

Figure 1:
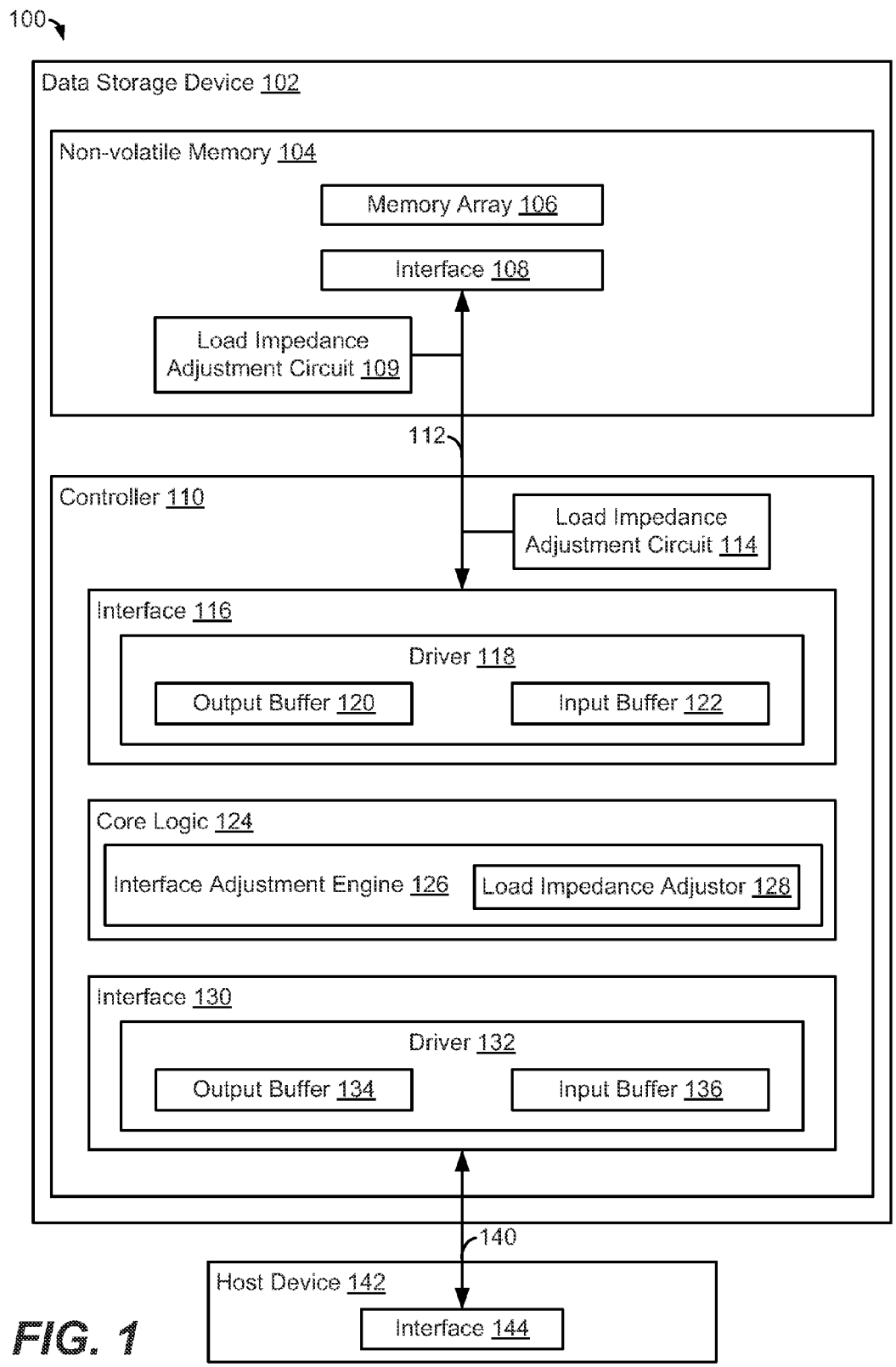
FIG. 1 is a diagram of a particular illustrative embodiment of an electronic device that includes a data storage device.

Referring to FIG. 1, a particular illustrative embodiment of an electronic device is depicted and generally designated 100. The electronic device 100 includes a data storage device 102 and a host device 142. The data storage device 102 may be embedded within the host device 142, such as in accordance with a Joint Electron Devices Engineering Council (JEDEC) Solid State Technology Association Universal Flash Storage (UFS) configuration. Alternatively, the data storage device 102 may be removable from (i.e., "removably" coupled to) the host device 142. For example, the data storage device 102 may be removably coupled to the host device 142 in accordance with a removable universal serial bus (USB) configuration.

The data storage device 102 may include a memory, such as a non-volatile memory 104, and a controller 110. The non-volatile memory 104 may include a memory array 106, an interface 108, and a load impedance adjustment circuit 109. The controller 110 may include a load impedance adjustment circuit 114, an interface 116, core logic 124, and an interface 130. The host device 142 may include an interface 144. The interfaces 108, 116, 130, 144 may include input/output (I/O) interfaces that are configured to send and receive data and other signals, such as commands and/or command responses.

The interfaces 116, 108 may be coupled via a connection 112. The connection 112 may include a bus or another structure. The load impedance adjustment circuits 109, 114 may be coupled to the connection 112. The interfaces 130, 144 may be coupled via a connection 140. The connection 140 may include a bus or another structure.

The interface 116 may include a driver 118. The driver 118 may be configured to send and receive signals via the connection 112. The driver 118 may include a signal source, such as an output buffer 120, and the driver 118 may include an input buffer 122.

The interface 130 may include a driver 132. The driver 132 may be configured to send and receive signals via the connection 140. The driver 132 may include a signal source, such as an output buffer 134, and the driver 132 may include an input buffer 136. Although not shown in FIG. 1, the interfaces 108, 144 may each include an input buffer and a signal source (e.g., an output buffer).

The core logic 124 may include one or more circuits configured to control one or more operations at the data storage device 102. For example, FIG. 1 depicts that the core logic 124 includes an interface adjustment engine 126. The interface adjustment engine 126 may include a load impedance adjustor 128. The load impedance adjustor 128 may be configured to adjust load impedances via the load impedance adjustment circuits 109, 114.

The controller 110 is configured to receive data and instructions from the host device 142 via the interface 130 and to send data to the host device 142 via the interface 130. For example, the controller 110 may send data to the host device 142 via the output buffer 134 and may receive data from the host device 142 via the input buffer 136. The controller 110 may store (e.g., buffer) data at a cache or a memory, such as a random access memory (RAM) included in the core logic 124.

The controller 110 is configured to send data and commands to the non-volatile memory 104 via the interface 116 and to receive data from the non-volatile memory 104 via the interface 116. For example, the controller 110 is configured to send data and a write command via the interface 116 to cause the non-volatile memory 104 to store the data to a specified address of the memory array 106. The data may include one or more error correcting code (ECC) codewords generated by an ECC encoder (not shown) of the core logic 124.

The controller 110 is configured to send a read command via the interface 116 to sense data from a specified address of the non-volatile memory 104. As an example, the controller 110 may send a read command to sense data stored at the memory array 106. The core logic 124 may include an ECC decoder (not shown) that is configured to decode the data sensed from the memory array 106.

The host device 142 may correspond to a mobile telephone, a music player, a video player, a gaming device or console, an electronic book reader, a personal digital assistant (PDA), a computer, such as a laptop, tablet, or notebook computer, a portable navigation device, another electronic device, or a combination thereof. The host device 142 may communicate via a host controller, which may enable the host device 142 to communicate with the data storage device 102 via the interface 144. The host device 142 may operate in compliance with a JEDEC Solid State Technology Association industry specification, such as an embedded Multi-Media Card (eMMC) specification or a Universal Flash Storage (UFS) Host Controller Interface specification. The host device 142 may operate in compliance with one or more other specifications, such as a Secure Digital (SD) Host Controller specification as an illustrative example. Alternatively, the host device 142 may communicate with the data storage device 102 in accordance with another communication protocol.

In operation, the interface adjustment engine 126 may reduce an impedance mismatch between certain components of the electronic device 100. For example, the interface adjustment engine 126 may adjust an impedance of a load that is responsive to the output buffer 120. Further, in certain implementations, the interface adjustment engine 126 may adjust an output impedance of a signal source in addition to adjusting an impedance of a load that is responsive to the signal source, as described further with reference to FIG. 3. The controller 110 may include one or more calibration sensors configured to measure one or more operational parameters (e.g., temperature, voltage, and/or impedance parameters). The interface adjustment engine 126 may be responsive to the one or more calibration sensors to generate one or more control signals to adjust a load impedance, as described further below.

To further illustrate, the load impedance adjustor 128 may reduce an impedance mismatch associated with the interfaces 108, 116, such as an impedance mismatch between an output impedance of a signal source of the interface 116 (e.g., the output buffer 120) and an impedance of a load that is responsive to the output buffer 120. The load may include one or more circuits and/or devices that are responsive to the output buffer 120. As a particular example, the load may include an impedance presented by the connection 112, the load impedance adjustment circuits, 109, 114, and the non-volatile memory 104. To reduce the impedance mismatch, the load impedance adjustor 128 may adjust an impedance of the load impedance adjustment circuit 109 (e.g., to increase or decrease an impedance of the load). The load impedance adjustor 128 may adjust an impedance of the load impedance adjustment circuit 109 to reduce an impedance mismatch between a signal source of the interface 108, such as an output buffer of the interface 108 (not shown), and a load that is responsive to the signal source. In a particular embodiment, the load impedance adjustment circuit 109 is responsive to the load impedance adjustor 128 via a command bus or another connection that is separate from the connection 112 (not shown). The load impedance adjustment circuits 109, 114 may each include a variable load, such as a plurality of capacitors, as described further with reference to FIG. 3.

Adjusting one or more load impedances using the load impedance adjustor 128 may enable impedance matching of certain components of the electronic device 100. In a particular embodiment, the techniques illustrated with reference to FIG. 1 may be used instead of performing adjustment of an output impedance of a signal source, which may decrease a circuit area of one or more of the interfaces 108, 116 (e.g., by reducing or eliminating calibration circuitry within an output buffer, such as the output buffer 120). In at least one alternative embodiment, both an output impedance and a load impedance can be adjusted to reduce an impedance mismatch. For example, adjustment of the output impedance may correspond to a "coarse" impedance adjustment, and adjustment of the load impedance may correspond to a "fine" impedance adjustment, as described further with reference to FIG. 3.

Figure 2:
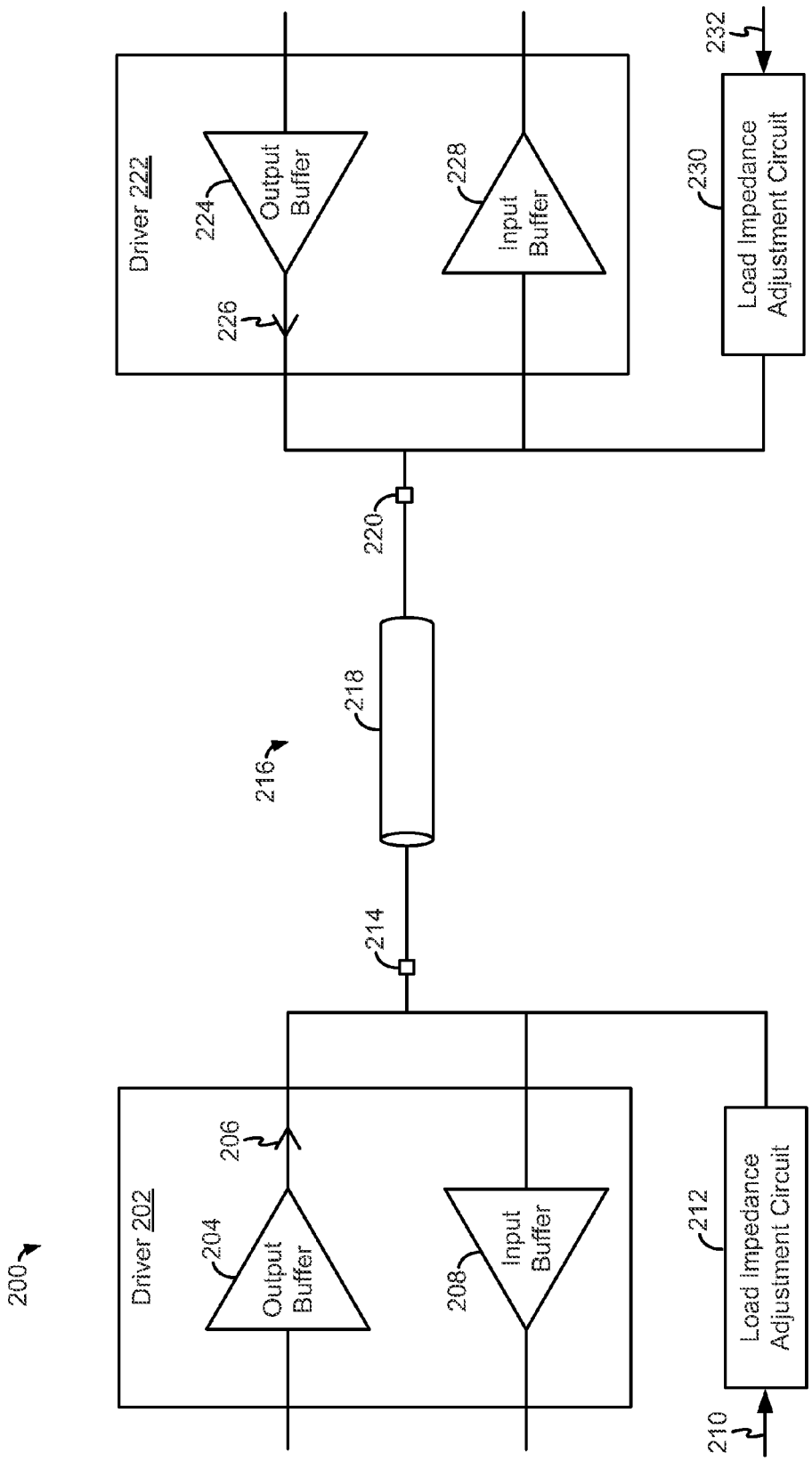
FIG. 2 is a diagram of a circuit that may be included in the data storage device of FIG. 1.

Referring to FIG. 2, a particular illustrative embodiment of a circuit is depicted and generally designated 200. The circuit 200 includes a driver 202, a load impedance adjustment circuit 212, a connection 216, a driver 222, and a load impedance adjustment circuit 230.

The circuit 200 may be implemented within the electronic device 100 of FIG. 1. For example, the driver 202 may correspond to the driver 118, the connection 216 may correspond to the connection 112, the load impedance adjustment circuit 212 may correspond to the load impedance adjustment circuit 114, the load impedance adjustment circuit 230 may correspond to the load impedance adjustment circuit 109, and the driver 222 may be included in the interface 108.

The driver 202 may include an output buffer 204 and an input buffer 208. The output buffer 204 may be configured to generate an output signal 206. The output buffer 204 and the input buffer 208 may correspond to the output buffer 120 and the input buffer 122, respectively. The driver 222 may include an output buffer 224 and an input buffer 228. The output buffer 224 may be configured to generate an output signal 226.

The connection 216 may operationally couple the drivers 202, 222. The connection 216 may include a pad 214, such as an input/output (I/O) port, and a pad 220 (e.g., an I/O port). The connection 216 may be modeled as (or may include) a transmission line 218. The transmission line 218 may have a lumped parameter impedance that corresponds to an impedance of a load that is responsive to a signal source. To illustrate, while the output buffer 204 is driving the output signal 206, the transmission line 218 may have a lumped parameter impedance that corresponds to an impedance of a load that is responsive to the output buffer 204. While the output buffer 224 is driving the output signal 226, the transmission line 218 may have a lumped parameter impedance that corresponds to an impedance of a load that is responsive to the output buffer 224.

In operation, the load impedance adjustment circuit 230 may be adjusted to reduce an impedance mismatch between the output buffer 204 and a load that is responsive to the output buffer 204. The load may include the connection 216, the load impedance adjustment circuits 212, 230, and one or more circuits that are connected to the connection 216, such as the input buffer 228. The impedance mismatch may indicate a difference between an output impedance of the output buffer 204 and the impedance of the load.

The load impedance adjustment circuit 230 may be adjusted via a control signal 232, and the load impedance adjustment circuit 212 may be adjusted via a control signal 210. In at least one embodiment, one or more of the control signals 210, 232 may be generated by the load impedance adjustor 128. To illustrate, the controller 110 and the non-volatile memory 104 may be coupled via a command bus or another connection in addition to the connection 112 (not shown in FIG. 1). The load impedance adjustor 128 may send the control signal 232 to the non-volatile memory 104 via the command bus or other connection. Although the control signals 210, 232 are each described as a single signal for convenience of description, it should be appreciated that one or more of the control signals 210, 232 may correspond to multiple control signals, as described with reference to FIG. 3.

The output buffer 204 may send the output signal 206 via the connection 216, and the driver 222 may receive the output signal 206 via the input buffer 228. The load impedance adjustment circuit 212 may be disabled while the output buffer 204 is sending the output signal 206, and the load impedance adjustment circuit 230 may be enabled while the output buffer 204 is sending the output signal 206. For example, the load impedance adjustor 128 may cause the load impedance adjustment circuit 212 to enter a high impedance state (e.g., via the control signal 210) to disable the load impedance adjustment circuit 212.

The driver 222 may send one or more signals to the input buffer 208. For example, the driver 222 may send the output signal 226 to the input buffer 208 via the connection 216. The load impedance adjustment circuit 212 may be adjusted to reduce an impedance mismatch between the output buffer 224 and a load that is responsive to the output buffer 224. The load may include the connection 216, the load impedance adjustment circuits 212, 230, and one or more circuits that are responsive to the connection 216, such as the input buffer 208. The load impedance adjustment circuit 212 may be adjusted via the control signal 210. While the output buffer 224 is sending the output signal 226, the load impedance adjustment circuit 230 may be disabled.

The load impedance adjustment circuits 212, 230 enable load impedance transformation for the circuit 200. By using the load impedance adjustment circuits 212, 230 to adjust load impedances, impedance calibration circuitry of the output buffers 204, 224 can be avoided, reducing complexity of the output buffers 204, 224. In at least one alternate embodiment, adjustment of an output impedance may be implemented as a "coarse" impedance adjustment, and adjustment of the load impedance may be implemented as a "fine" impedance adjustment, as described further with reference to FIG. 3.

Figure 3:
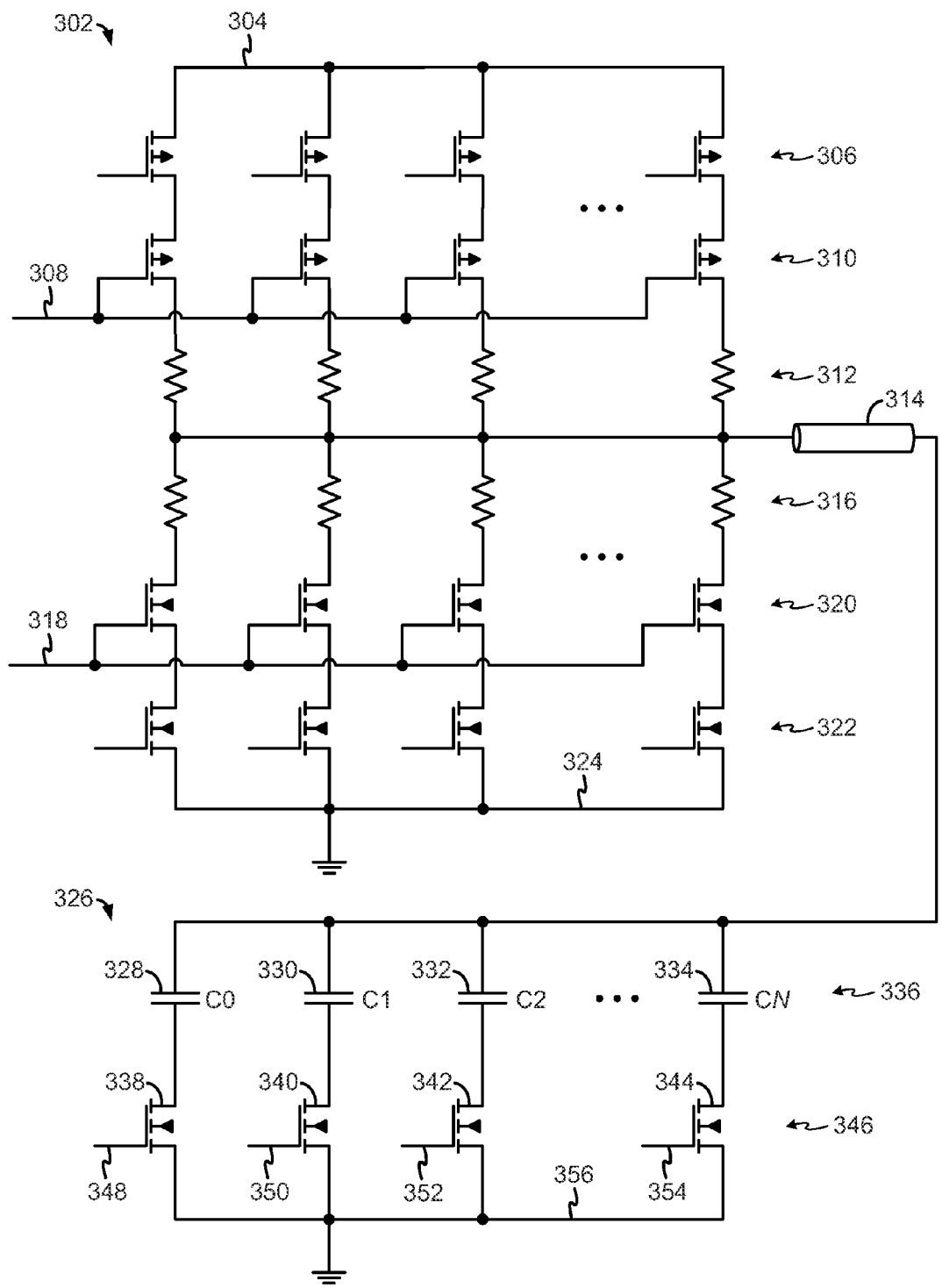
FIG. 3 is a diagram of an output buffer and a load impedance adjustment circuit that may be included in the data storage device of FIG. 1.

Referring to FIG. 3, a particular illustrative embodiment of an output buffer 302 and a load impedance adjustment circuit 326 are shown. The output buffer 302 may be implemented as one or more of the output buffers described herein, such as one or more of the output buffers 120, 134, 204, and 224. The load impedance adjustment circuit 326 may be implemented as one or more load impedance adjustment circuits described herein, such as one or more of the load impedance adjustment circuits 109, 114, 212, and 230.

The output buffer 302 and the load impedance adjustment circuit 326 may be coupled via a connection 314. The connection 314 may correspond to one or more connections described herein, such as one or more of the connections 112, 140, and 216.

The output buffer 302 includes a plurality of transistors 306, a plurality of transistors 310, a plurality of resistors 312, a plurality of resistors 316, a plurality of transistors 320, and a plurality of transistors 322. The plurality of transistors 306 may be coupled to a voltage supply node 304. The plurality of transistors 310 may be responsive to a data signal 308. The pluralities of resistors 312, 316 may be coupled to the connection 314. The plurality of transistors 320 may be responsive to a data signal 318. The plurality of transistors 322 may be coupled to a ground node 324.

The plurality of transistors 306 may include transistors of various sizes that can be selectively activated and deactivated via control signals to adjust an output impedance of the output buffer 302. As a particular example, the plurality of transistors 306 may include a first transistor having a width-to-length ratio W/L, a second transistor having a width-to-length ratio of approximately 2(W/L), a third transistor having a width-to-length ratio of approximately 4(W/L), and an Nth transistor having a width-to-length ratio of approximately (2^N)(W/L), where N is a positive integer that indicates a number of transistors of the plurality of transistors 306. Each of the plurality of transistors 306 may have a gate terminal that is responsive to a respective control signal that selectively activates or deactivates the gate terminal to selectively couple one or more of the plurality transistors 306 to the voltage supply node 304.

The plurality of transistors 322 may include transistors of various sizes that can be selectively activated and deactivated via control signals to adjust an output impedance of the output buffer 302. As a particular example, the plurality of transistors 322 may include a first transistor having a width-to-length ratio equal to W/L, a second transistor having a width-to-length ratio of approximately 2(W/L), a third transistor having a width-to-length ratio of approximately 4(W/L), and an Nth transistor having a width-to-length ratio of approximately (2^N)(W/L), where N is a positive integer that indicates a number of transistors of the plurality of transistors 322. Each of the plurality of transistors 322 may have a gate terminal that is responsive to a respective control signal that selectively activates or deactivates the gate terminal to selectively couple one or more of the plurality of transistors 322 to the ground node 324.

The load impedance adjustment circuit 326 may include a plurality of capacitors 336 and a plurality of transistors 346. In the particular example of FIG. 3, the plurality of capacitors 336 includes a capacitor 328, a capacitor 330, a capacitor 332, and a capacitor 334. The plurality of capacitors 336 may be coupled to the connection 314. The plurality of transistors 346 may include a transistor 338, a transistor 340, a transistor 342, and a transistor 344. The plurality of transistors 346 may be coupled to a ground node 356.

Each transistor of the plurality of transistors 346 may be responsive to a respective control signal. For example, the transistor 338 may be responsive to a control signal 348, and the transistor 340 may be responsive to a control signal 350. As another example, the transistor 342 may be responsive to a control signal 352, and the transistor 344 may be responsive to a control signal 354. The control signals 348, 350, 352, and 354 may correspond to one or more of the control signals 210, 232. For example, the control signals 348, 350, 352, and 354 may each correspond to a particular bit of a digital code generated by the interface adjustment engine 126, where the control signal 210 includes the digital code. As another example, the control signal 232 may include the digital code.

Each capacitor of the plurality of capacitors 336 may be associated with a particular capacitance. For example, the particular example of FIG. 3 indicates that the capacitor 328 is associated with a capacitance C0 and that the capacitor 330 is associated with a capacitance C1. The capacitor 332 may be associated with a capacitance C2, and the capacitor 334 may be associated with a capacitance CN, where N is a positive integer that indicates a number of capacitors of the plurality of capacitors 336. The capacitances C0, C1, C2, and CN may be selected to enable load impedance adjustment. In a particular illustrative embodiment, the capacitance C1 is approximately twice the capacitance C0, the capacitance C2 is approximately four times the capacitance C0, and the capacitance CN is approximately $2^N$ times the capacitance C0.

In operation, the output buffer 304 may generate an output signal at the connection 314 based on the data signals 308, 318. For example, when the data signals 308, 318 have a logical "0" value, the plurality of transistors 310 may "pull up" a voltage at the connection 314 by coupling the connection 314 to the voltage supply node 304. When the data signals 308, 318 have a logical "1" value, the plurality of transistors 320 may "pull down" the voltage at the connection 314 by coupling the connection 314 to the ground node 324.

The output buffer 302 and the impedance adjustment circuit 326 may be adjusted to reduce an impedance mismatch between an output impedance of the output buffer 302 and a load that is responsive to the output buffer 302. For example, each capacitor of the plurality of capacitors 336 may be selectively enabled or disabled to adjust an impedance of the impedance adjustment circuit 326 (and to change an impedance of the load). In a particular illustrative embodiment, the load impedance adjustor 128 of the interface adjustment engine 126 generates the control signals 348, 350, 352, 354 to selectively activate or deactivate each of the plurality of transistors 346, thus enabling or disabling each of the plurality of capacitors 336.

In the example of FIG. 3, an output impedance of the output buffer 302 may be controlled to reduce an impedance mismatch between the output impedance of the output buffer 302 and an impedance of a load that is responsive to the output buffer 302. Alternatively, depending on the particular implementation, an output buffer may have a substantially fixed output impedance. For example, in a particular embodiment, the load impedance adjustment circuit 326 is coupled to an output buffer that is configured to maintain a substantially fixed drive strength instead of having an adjustable output impedance. In such an implementation, the interface adjustment engine 126 may be configured to maintain a particular output impedance of the output buffer 302 (e.g., a substantially fixed output impedance) while adjusting the load impedance via the load impedance adjustment circuit 326. In this implementation, the output buffer may exclude output impedance calibration circuitry. Alternatively, the interface adjustment engine 126 may be configured to adjust an output impedance of the output buffer 302 in addition to adjusting the load impedance. For example, the output buffer 302 may have an adjustable output impedance that "coarsely" reduces an impedance mismatch, and the impedance adjustment circuit 326 may have an adjustable impedance that "finely" reduces the impedance mismatch, as illustrated with reference to the example of FIG. 3.

In FIG. 3, each transistor of the pluralities of transistors 306, 322 may be selectively activated or deactivated to adjust an output impedance of the output buffer 302. For example, the interface adjustment engine 126 may generate a plurality of control signals that selectively activate or deactivate gate terminals of the pluralities of transistors 306, 322. As a particular illustrative example, the output impedance of the output buffer 302 may be coarsely adjusted to bring the impedance of the load within a particular target range (e.g., to approximately 30, 40, 50, or 60 ohms, plus or minus 10 ohms), and the impedance of the load impedance adjustment circuit 326 may be finely adjusted to "fine-tune" the impedance of the load (e.g., from 30 to 32 ohms, from 40 to 39 ohms, from 50 to 55 ohms, from 60 to 68 ohms, etc.). It should be appreciated that the specific value of the load impedance will depend on the particular application and may differ from the foregoing illustrative examples.

In a particular illustrative embodiment, the output impedance of the output buffer 302 is adjusted to compensate for one or more process variations of an integrated circuit that includes the output buffer 302. For example, if a process variation of the integrated circuit causes the impedance mismatch to exceed an expected range or tolerance that is specified by a design specification of the integrated circuit, the output impedance of the output buffer 302 may be adjusted to brining the impedance mismatch within the expected range or tolerance. In such an implementation, the impedance of the load impedance adjustment circuit 326 can be adjusted to "finely" adjust the load impedance after the impedance mismatch is brought within the expected range or tolerance.

The example of FIG. 3 illustrates an impedance matching technique that enables coarse and fine impedance matching. Because the fine adjustment may be performed by a circuit that is external to the output buffer 302 (e.g., by the load impedance adjustment circuit 326), an amount of calibration circuitry of the output buffer 302 (e.g., a number of the pluralities of transistors 306, 322) may be reduced as compared to a device that performs impedance matching exclusively by calibrating an output impedance of a signal source. Therefore, a circuit area of a "pad ring" of an integrated circuit can be reduced, enabling a reduction in circuit area of the integrated circuit, which may reduce device cost in certain circumstances (e.g., for a "pad-limited" integrated circuit design).

Figure 4:
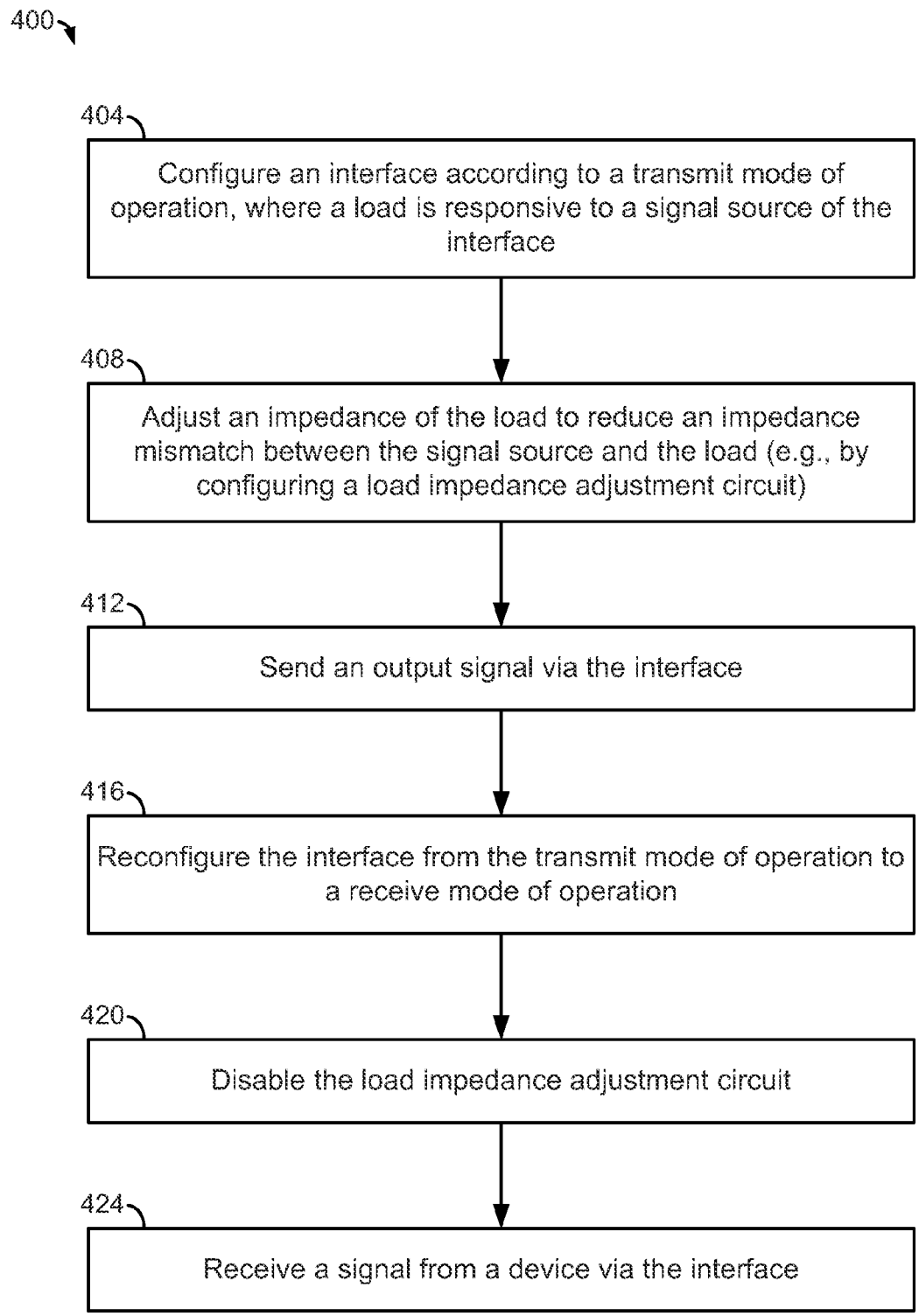
FIG. 4 is a flow diagram of a particular illustrative embodiment of a method of operating an interface, such as an interface of the data storage device of FIG. 1.

Referring to FIG. 4, a particular illustrative embodiment of a method of operating an interface is depicted and generally designated 400. The method 400 may be performed at the electronic device 100. For example, the method 400 may be performed by the controller 110, and the interface may correspond to the interface 116. In a particular embodiment, the method 400 is performed by the interface adjustment engine 126.

The method 400 may include configuring the interface according to a transmit mode of operation, at 404. The transmit mode of operation may correspond to a mode of operation in which signals are sent (e.g., via an output buffer). A load is responsive to a signal source of the interface. The signal source may correspond to an output buffer, such as one of the output buffers 120, 134, 204, 224, and 302. The load may be circuitry that is responsive to an output signal generated by the signal source. The output signal may correspond to either of the output signals 206, 226, as illustrative examples.

The method 400 may further include adjusting an impedance of the load to reduce an impedance mismatch between the signal source and the load, at 408. Adjusting the load impedance may include configuring a load impedance adjustment circuit. The load impedance adjustment circuit may correspond to one of the load impedance adjustment circuits 109, 114, 212, 230, 326.

The method 400 may further include sending an output signal via the interface, at 412. As a particular example, the output signal may correspond to either of the output signals 206, 226. The signal may be sent via any of the connections 112, 140, 216, and 314.

The method 400 may further include reconfiguring the interface from the transmit mode of operation to a receive mode of operation, at 416. The receive mode of operation may correspond to a mode of operation in which signals are received (e.g., by an input buffer). Reconfiguring the interface may include disabling the output buffer 120 and enabling the input buffer 122. As another example, reconfiguring the interface may include disabling the output buffer 204 and enabling the input buffer 208.

The method 400 may further include disabling the load impedance adjustment circuit, at 420. As a particular illustrative example, each of the plurality of transistors 346 may be deactivated to cause the load impedance adjustment circuit 326 to enter a high impedance state. The plurality of transistors 346 may be deactivated via the control signals 348, 350, 352, and 354. When the load impedance adjustment circuit is disabled, another load impedance adjustment circuit may be enabled. As a particular example, when one of the load impedance adjustment circuits 212, 230 is disabled, the other of the load impedance adjustment circuits 212, 230 may be enabled.

The method 400 may further include receiving a signal from a device via the interface, at 424. As a particular example, the output signal 226 may be received at the input buffer 208. The device may correspond to the non-volatile memory 104, the controller 110, or the host device 142, depending on the particular implementation.

The method 400 may enable increased resolution of impedance matching without increasing a pad ring area of a device. For example, using the method 400 may enable an impedance of a load to be adjusted instead of adjusting an output impedance of a signal source to reduce an impedance mismatch. The load impedance may be adjusted using an impedance adjustment circuit that can be external to the signal source. The method 400 therefore reduces or eliminates impedance matching components that are located within the output buffer, thus increasing available pad area, which is valuable in certain circuit designs, such as pad-limited integrated circuit designs. Further, in certain pad-limited integrated circuit designs, fine impedance matching resolution by adjusting the output impedance may be infeasible due to limitations of the size of the pad area. By using the impedance adjustment circuit described with reference to FIGS. 1-4, fine impedance matching resolution can be achieved without increasing a pad area.

Figure 5:
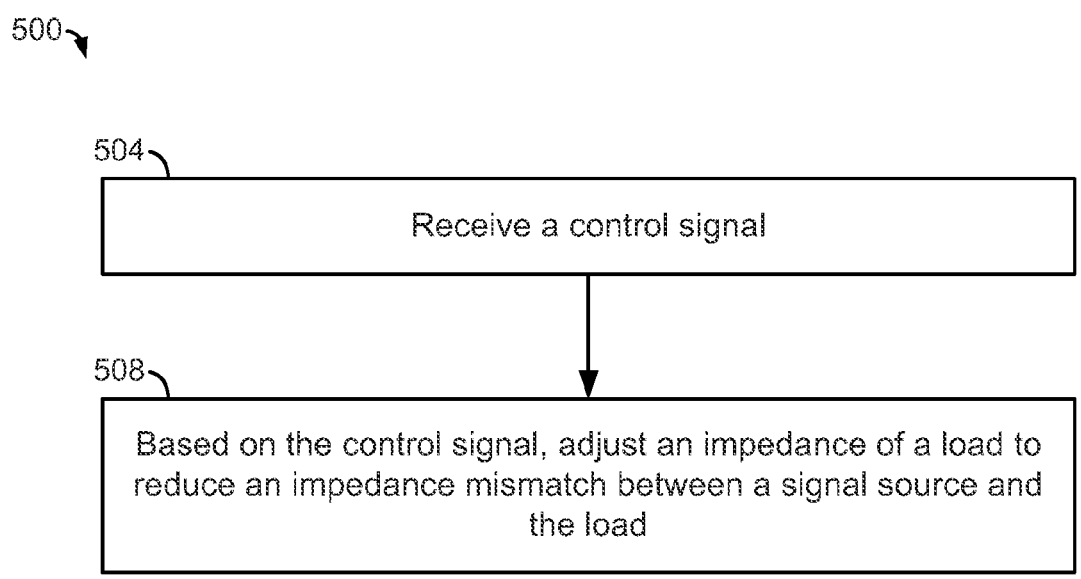
FIG. 5 is a flow diagram of another particular illustrative embodiment of a method of operating an interface, such as an interface of the data storage device of FIG. 1.

Referring to FIG. 5, another particular illustrative embodiment of a method of operating an interface is depicted and generally designated 500. The method 500 may be performed at the electronic device 100. For example, the method 500 may be performed by one or more of the load impedance adjustment circuits 109, 114, 212, 230, and 326 or by logic or a controller coupled thereto. The interface may correspond to the interface 116, as an illustrative example.

The method 500 may include receiving a control signal, at 504. The control signal may correspond to one or more of the control signals 210, 232, 348, 350, 352, and 354.

The method 500 may further include adjusting an impedance of a load to reduce an impedance mismatch between a signal source and the load based on the control signal, at 508. The signal source may correspond to an output buffer, such as one of the output buffers 120, 134, 204, 224, and 302. The load may be circuitry that is responsive to an output signal generated by the signal source. In a particular embodiment, the control signal selectively activates (and/or deactivates) one or more transistors of the plurality of transistors 346 to adjust the impedance mismatch.

The method 500 may enable reduction of device size (e.g., die size) of an integrated circuit. For example, reducing an impedance mismatch by adjusting an impedance of a load may reduce (or eliminate) a number of output impedance matching components that are located within an output buffer, increasing available pad area. Pad area is valuable in certain circuit designs, such as pad-limited integrated circuit designs. By "freeing" pad area in a pad-limited integrated circuit design, die size of the integrated circuit may be reduced.

It should be appreciated that examples provided herein are illustrative and are not intended to limit the scope of the disclosure. For example, FIG. 1 depicts that the data storage device 102 includes two interfaces (i.e., the interfaces 116, 130) and two load impedance adjustment circuits (i.e., the load impedance adjustment circuits 109, 114). However, the data storage device 102 may include a different number of interfaces and/or load impedance adjustment circuits, depending on the particular implementation (e.g., three interfaces and one load impedance adjustment circuit, two interfaces and one load impedance adjustment circuit, etc.). Further, although certain components and/or operations have been described with reference to the controller 110, it should be appreciated that one or more components and/or operations can be implemented at the non-volatile memory 104 and/or at the host device 142. For example, depending on the particular implementation, one or more components and/or operations described with reference to the interface adjustment engine 126 and/or the load impedance adjustment circuit 114 may be implemented at the non-volatile memory 104 and/or at the host device 142, depending on the particular implementation.

To further illustrate, although certain techniques have been described herein with reference to the interfaces 108, 116 for convenience of description, one or more techniques may be applied to the interfaces 130, 144 alternatively or in addition to the interfaces 108, 116. For example, the controller 110 may include a load impedance adjustment circuit coupled to the connection 140, and the host device 142 may include a load impedance adjustment circuit coupled to the connection 140. In such an example, the driver 202 may correspond to the driver 132, the connection 216 may correspond to the connection 140, and the driver 222 and the load impedance adjustment circuit 230 may be included in the host device 142. In another illustrative example, the output buffer 302 may correspond to the output buffer 134, the connection 314 may correspond to the connection 140, and the impedance adjustment circuit 326 may be included in the host device 142.

Accordingly, one or more operations of the method 400 may be performed at the non-volatile memory 104, at the controller 110, at the host device 142, or a combination thereof. For example, one or more operations of the method 400 may be performed by the controller 110, and the interface may correspond to the interface 116 and/or the interface 130. In a particular embodiment, the method 400 is performed by the interface adjustment engine 126. As another example, one or more operations of the method 400 may be performed by the non-volatile memory 104, and the interface may correspond to the interface 108. As another example, one or more operations of the method 400 may be performed by the host device 142, and the interface may correspond to the interface 144.

Operation of the circuit 200 of FIG. 2 has been described according to a particular illustrative configuration for convenience of description. For example, operation of the circuit 200 has been described to include disabling the load impedance adjustment circuit 212 while sending the output signal 206 and disabling the load impedance adjustment circuit 230 while sending the output signal 226. It should be appreciated that the load impedance adjustment circuit 212 may be disabled while sending the output signal 226 and that the load impedance adjustment circuit 230 may be disabled while sending the output signal 206 without departing from the scope of the present disclosure.

Although one or more components described herein are illustrated as block components and described in general terms, such components may include one or more microprocessors, state machines, or other circuits configured to enable the data storage device 102 (or one or more components thereof) to perform operations described herein. For example, one or more components described herein may correspond to one or more physical components, such as hardware controllers, state machines, logic circuits, one or more other structures, or a combination thereof, to enable the non-volatile memory 104, the controller 110, and/or the host device 142 to perform one or more operations described herein. One or more aspects of the non-volatile memory 104, the controller 110, and/or the host device 142 may be implemented using a microprocessor or microcontroller programmed to perform operations described herein, such as one or more operations of the method 400. In a particular embodiment, the non-volatile memory 104, the controller 110, and/or the host device 142 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, the interface adjustment engine 126 may include a processor that is configured to execute instructions to adjust an impedance of a load to reduce an impedance mismatch between a signal source and the load. The processor may execute instructions that cause the processor to measure a load impedance. For example, one or more calibration sensors included in one or both of the interfaces 116, 130 may measure voltages and currents to determine the load impedance. To illustrate, if the signal source is the output buffer 204 and the load includes a circuit that is responsive to the output signal 206, a voltage of the output signal 206 may be maintained (e.g., by maintaining a fixed drive strength of the output buffer 204) and a current of the output signal 206 may be measured by the one or more calibration sensors. The processor may execute one or more instructions to determine (or estimate) an impedance of the load based on the voltage of the output signal 206 and the current of the output signal 206 (e.g., by executing one or more instructions to divide a magnitude of the voltage by a magnitude of the current).

The processor may execute one or more instructions to compare the load impedance to an output impedance of the output buffer 204, such as an output impedance of the output buffer 204 that is calibrated during fabrication of the circuit 200. If the load impedance mismatches the output impedance of the output buffer 204, the processor may execute one or more instructions to adjust the load impedance adjustment circuit 230 via the control signal 232. In a particular embodiment, the load impedance adjustment circuit 230 is adjusted by selectively activating one or more switches that are coupled to a plurality of capacitors in a manner as illustrated with reference to FIG. 3. If the processor determines that the load impedance matches the output impedance, the processor may re-estimate the load impedance at a later time (e.g., by periodically or occasionally re-estimating the load impedance) to adjust for temperature variations, voltage variations, and/or other phenomena.

In a particular embodiment, the data storage device 102 may be attached to or embedded within one or more host devices, such as within a housing of a host communication device, which may correspond to the host device 142. For example, the data storage device 102 may be integrated within a packaged apparatus such as a mobile telephone, a music player, a video player, a gaming device or console, an electronic book reader, a personal digital assistant (PDA), a computer, such as a laptop, tablet, or notebook computer, a portable navigation device, or other device that uses internal non-volatile memory. However, in other embodiments, the data storage device 102 may be implemented in a portable device configured to be selectively coupled to one or more external devices, such as the host device 142.

To further illustrate, the data storage device 102 may be configured to be coupled to the host device 142 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the non-volatile memory 104 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a first component including a signal source and a second component including a load responsive to the signal source, performing:
   sensing an impedance mismatch between an output impedance of the signal source and an impedance of the load; and
   in response to detecting the impedance mismatch, sending a control signal from the first component to a load impedance adjustment circuit in the second component to adjust an impedance of the load to reduce the impedance mismatch, wherein the load impedance adjustment circuit includes a plurality of capacitors having different capacitance values.

2. The method of claim 1, wherein the signal source comprises an output buffer of an interface, wherein the load includes circuitry that is responsive to an output signal generated by the output buffer, wherein the output impedance of the signal source comprises an output impedance of the output buffer, and wherein the impedance mismatch indicates a difference between the output impedance of the output buffer and the impedance of the load.

3. The method of claim 1, wherein the load impedance adjustment circuit adjusts the impedance of the load by selecting one or more of the plurality of capacitors.

4. The method of claim 1, wherein the load impedance adjustment circuit further includes a plurality of transistors coupled to the plurality of capacitors, and wherein the load impedance adjustment circuit selects one or more of the plurality of capacitors by enabling one or more of the plurality of transistors.

5. The method of claim 1, further comprising maintaining the output impedance of the signal source at a particular output impedance while adjusting the impedance of the load via the load impedance adjustment circuit.

6. The method of claim 1, further comprising adjusting the output impedance of the signal source while adjusting the impedance of the load via the load impedance adjustment circuit.

7. The method of claim 6, wherein adjusting the impedance of the load is a fine impedance adjustment, and wherein adjusting the output impedance of the signal source is a coarse impedance adjustment.

8. The method of claim 1, wherein the data storage device includes a controller and a non-volatile memory that is coupled to the controller, wherein the load includes the non-volatile memory.

9. The method of claim 1, wherein the data storage device includes a controller and a non-volatile memory that is coupled to the controller, wherein the load includes the controller.

10. The method of claim 1, wherein the data storage device includes a controller, and wherein the load includes a host device that is coupled to the controller.

11. The method of claim 1, wherein the load includes a device that is coupled to the data storage device, and further comprising:
   reconfiguring an interface that includes the signal source from a transmit mode of operation to a receive mode of operation; and
   disabling the load impedance adjustment circuit when the interface is in the receive mode of operation.

12. A memory controller comprising:
   a signal source; and
   an interface adjustment engine associated with the signal source and configured to be coupled to an external load, the interface adjustment engine comprises a load impedance adjustor and is configured to send a control signal to a load impedance adjustment circuit to adjust an impedance of the external load to reduce an impedance mismatch between an output impedance of the signal source and the impedance of the external load.

13. The memory controller of claim 12, wherein the signal source includes an output buffer, wherein the external load includes circuitry that is responsive to an output signal generated by the output buffer, wherein the output impedance of the signal source comprises an output impedance of the output buffer, and wherein the impedance mismatch indicates a difference between the output impedance of the output buffer and the impedance of the external load.

14. The memory controller of claim 12, wherein the interface adjustment engine is further configured to adjust the impedance of the external load by selecting one or more capacitors of a plurality of capacitors of the load impedance adjustment circuit.

15. The memory controller of claim 12, wherein the load impedance adjustment circuit further comprises a plurality of transistors coupled to a plurality of capacitors, and wherein the interface adjustment engine is further configured to select one or more of the plurality of capacitors by enabling one or more of the plurality of transistors.

16. The memory controller of claim 12, wherein the interface adjustment engine is further configured to maintain the output impedance of the signal source at a particular output impedance while adjusting the impedance of the external load via the load impedance adjustment circuit.

17. The memory controller of claim 12, wherein the interface adjustment engine is further configured to adjust the output impedance of the signal source while adjusting the impedance of the external load via the load impedance adjustment circuit, wherein adjusting the impedance of the external load includes a fine impedance adjustment, and wherein adjusting the output impedance of the signal source includes a coarse impedance adjustment.

18. The memory controller of claim 12, further comprising a non-volatile memory and a controller, wherein the controller includes the interface adjustment engine, and wherein the external load includes the non-volatile memory.

19. The memory controller of claim 12, further comprising a controller that includes the interface adjustment engine, and wherein the external load includes a host device that is coupled to the controller.

20. A device comprising:
  a first component comprising a signal source and an interface adjustment engine; and
  a second component comprising an impedance adjustment circuit and a load that is responsive to the signal source, the interface adjustment engine comprises a load impedance adjustor and is configured to detect an impedance mismatch between an output impedance of the signal source and an impedance of the load, the impedance adjustment circuit configured to adjust the impedance of the load to reduce the impedance mismatch.

21. The device of claim 20, the first component comprising a memory controller, the second component comprising a memory.

22. The device of claim 20, the first component comprising a memory, the second component comprising a memory controller.

23. The device of claim 20, wherein the signal source includes an output buffer and wherein the output impedance of the signal source comprises an output impedance of the output buffer.

24. The device of claim 20, wherein the interface adjustment engine is further configured to adjust the impedance of the load by selecting one or more capacitors of a plurality of capacitors of the impedance adjustment circuit.

* * * * *